(12) United States Patent
Sung

(10) Patent No.: US 7,212,037 B2
(45) Date of Patent: May 1, 2007

(54) MULTI-LEVEL SHIFTER HAVING SMALL CHIP SIZE AND SMALL CURRENT CONSUMPTION

(75) Inventor: Si-Wang Sung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 129 days.

(21) Appl. No.: 11/058,827

(22) Filed: Feb. 16, 2005

(65) Prior Publication Data

US 2005/0179464 A1  Aug. 18, 2005

(30) Foreign Application Priority Data

Feb. 16, 2004  (KR) .................. 10-2004-0009941

(51) Int. Cl.
*H03K 19/0175* (2006.01)
(52) U.S. Cl. .......................... 326/83; 326/68
(58) Field of Classification Search .................. 326/63, 326/68, 80–83, 86; 345/204
See application file for complete search history.

(56) References Cited

U.S. PATENT DOCUMENTS

| | | | | |
|---|---|---|---|---|
| 5,751,177 A | * | 5/1998 | Tanoi ........................ | 327/333 |
| 5,994,968 A | * | 11/1999 | Iravani et al. ................ | 331/57 |
| 6,191,616 B1 | | 2/2001 | Merritt et al. ................ | 326/81 |
| 6,307,398 B2 | | 10/2001 | Merritt et al. ................ | 326/81 |
| 7,005,912 B2 | * | 2/2006 | Nonaka ...................... | 327/536 |
| 2003/0107414 A1 | * | 6/2003 | Cho ........................... | 327/108 |

FOREIGN PATENT DOCUMENTS

| | | |
|---|---|---|
| JP | 2-165223 | 6/1989 |
| KR | 2000-73629 | 5/2000 |

* cited by examiner

*Primary Examiner*—Don Le
(74) *Attorney, Agent, or Firm*—F. Chau & Associates, LLC

(57) ABSTRACT

A multi-level shifter circuit is provided for a flat panel source driver, the multi-level shifter circuit having a voltage dropper for dropping a source voltage and outputting a dropped source voltage, and a plurality of level shifters to which the dropped source voltage is applied for receiving data bits and converting the level of the data, where the multi-level shifter circuit has a small chip size and consumes a small amount of current.

19 Claims, 6 Drawing Sheets

US 7,212,037 B2

MULTI-LEVEL SHIFTER HAVING SMALL CHIP SIZE AND SMALL CURRENT CONSUMPTION

CROSS-REFERENCE TO RELATED APPLICATION

This application claims foreign priority under 35 U.S.C. § 119 to Korean Patent Application No. 2004-9941, filed on Feb. 16, 2004, in the Korean Intellectual Property Office, the disclosure of which is incorporated herein by reference in its entirety.

BACKGROUND OF THE INVENTION

1. Field of the Invention

The present disclosure relates to flat panel source driver integrated circuits, and more particularly, to shifter circuits for a flat panel source driver.

2. Description of the Related Art

Flat panels of liquid crystal displays (LCDs), for example, have become larger with the development of LCD technology. Accordingly, chip size and current consumption of source drivers for LCD flat panels have also increased.

FIG. 1 is a block diagram of a conventional flat panel source driver. A 6-bit source driver is shown in FIG. 1. Referring to FIG. 1, the source driver includes a multi-level shift circuit 11 for receiving data D<5:0> with a low voltage and complementary data DB<5:0>, and converting the levels of the data. The multi-level shift circuit converts the voltage of the data, and generates output data 0<5:0> with high voltage. A decoder 13 decodes the output data 0<5:0> of the multi-level shift circuit 11 in response to control signals C1 through C64, and a buffer 15 buffers the output of the decoder 13 and outputs display data OUT.

FIG. 2 is a circuit diagram of the multi-level shifter circuit 11. Referring to FIG. 2, the conventional multi-level shifter circuit 11 includes six level shifters 21 through 26. The six level shifters 21 through 26 each receive a corresponding bit of the data D<5:0> and a corresponding bit of the complementary data DB<5:0>, convert the level of the bits of data D<5:0> and the complementary data DB<5:0>, and generate the output data 0<5:0>. The level shifters 21 through 26 each include four PMOS transistors, such as P1B, P2B, P3B, and P4B for the level shifter 22, and two NMOS transistors, such as N1B and N2B for the level shifter 22.

Generally, a source driver includes thousands of conventional multi-level shifter circuits 11. Therefore, the source driver including the conventional multi-level shifter circuits 11 has a large chip size and consumes a large amount of current.

SUMMARY OF THE INVENTION

Embodiments of the present disclosure provide multi-level shifter circuits having smaller chip size and consuming less current than conventional multi-level shifter circuits.

According to an aspect of the present disclosure, there is provided a multi-level shifter circuit of a flat panel source driver, the multi-level shifter circuit having a voltage dropper for dropping a source voltage and outputting a dropped source voltage; and a plurality of level shifters for receiving data composed of a plurality of bits and converting the level of the data using the dropped source voltage.

The voltage dropper may have a first PMOS transistor including a source connected to the source voltage, a gate connected to the ground voltage, and a drain for outputting the dropped source voltage, and a second PMOS transistor including a source connected to the source voltage, a gate connected to the ground voltage, and a drain for outputting the dropped source voltage.

Each of the level shifters may have a first PMOS transistor including a source connected to the dropped source voltage, a gate and a drain, a second PMOS transistor including a source connected to the dropped source voltage, a gate connected to the drain of the first PMOS transistor and a drain, a first NMOS transistor including a drain connected to the drain of the first PMOS transistor, a gate for receiving a corresponding bit of the data, and a source connected to the ground voltage, and a second NMOS transistor including a drain connected to the drain of the second PMOS transistor, a gate for receiving a corresponding bit of complementary data, and a source connected to the ground voltage.

The voltage dropper may have a first resistor for dropping the source voltage to the dropped source voltage, and a second resistor for dropping the source voltage to the dropped source voltage.

The voltage dropper may have a PMOS transistor including a source connected to the source voltage, a gate connected to the ground voltage, and a drain for outputting the dropped source voltage.

The voltage dropper may have a resistor for dropping the source voltage to the dropped source voltage.

BRIEF DESCRIPTION OF THE DRAWINGS

The above and other features and advantages of the present disclosure will become more apparent by describing in detail exemplary embodiments thereof with reference to the attached drawings, in which.

DETAILED DESCRIPTION OF PREFERRED EMBODIMENTS

Figure 1:
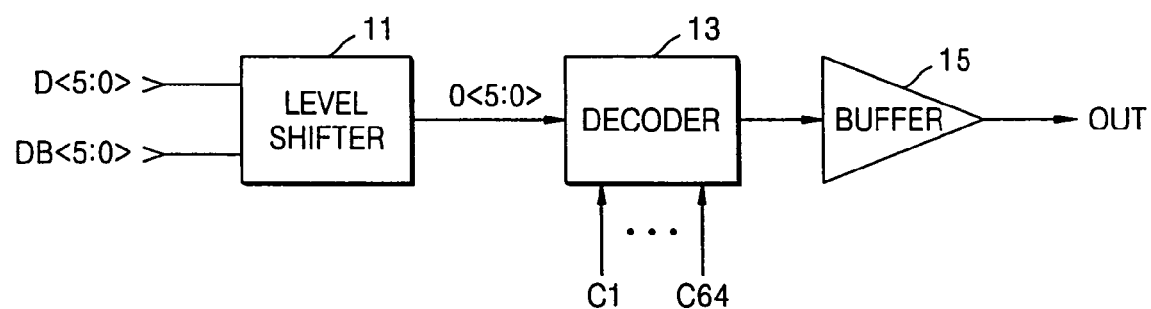
FIG. 1 is a block diagram of a conventional flat panel source driver.
Figure 2:
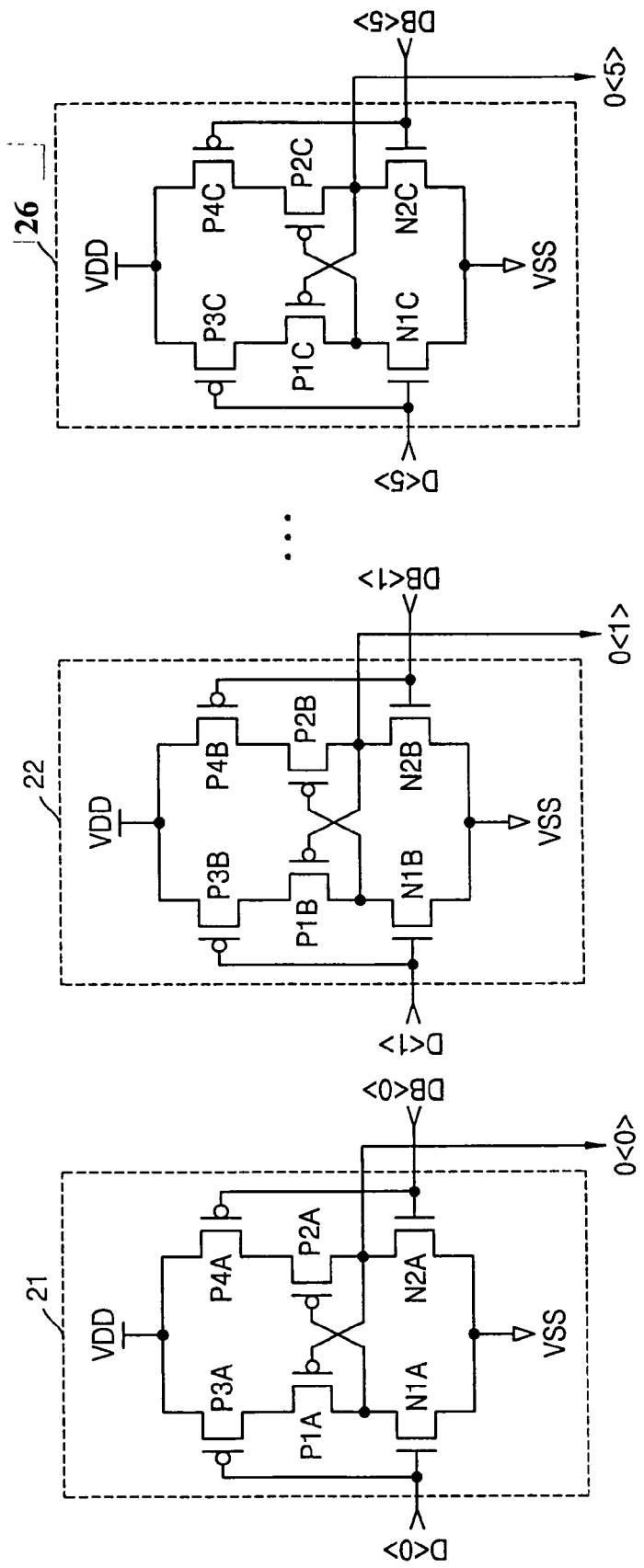
FIG. 2 is a circuit diagram of a conventional multi-level shifter circuit.
Figure 3:
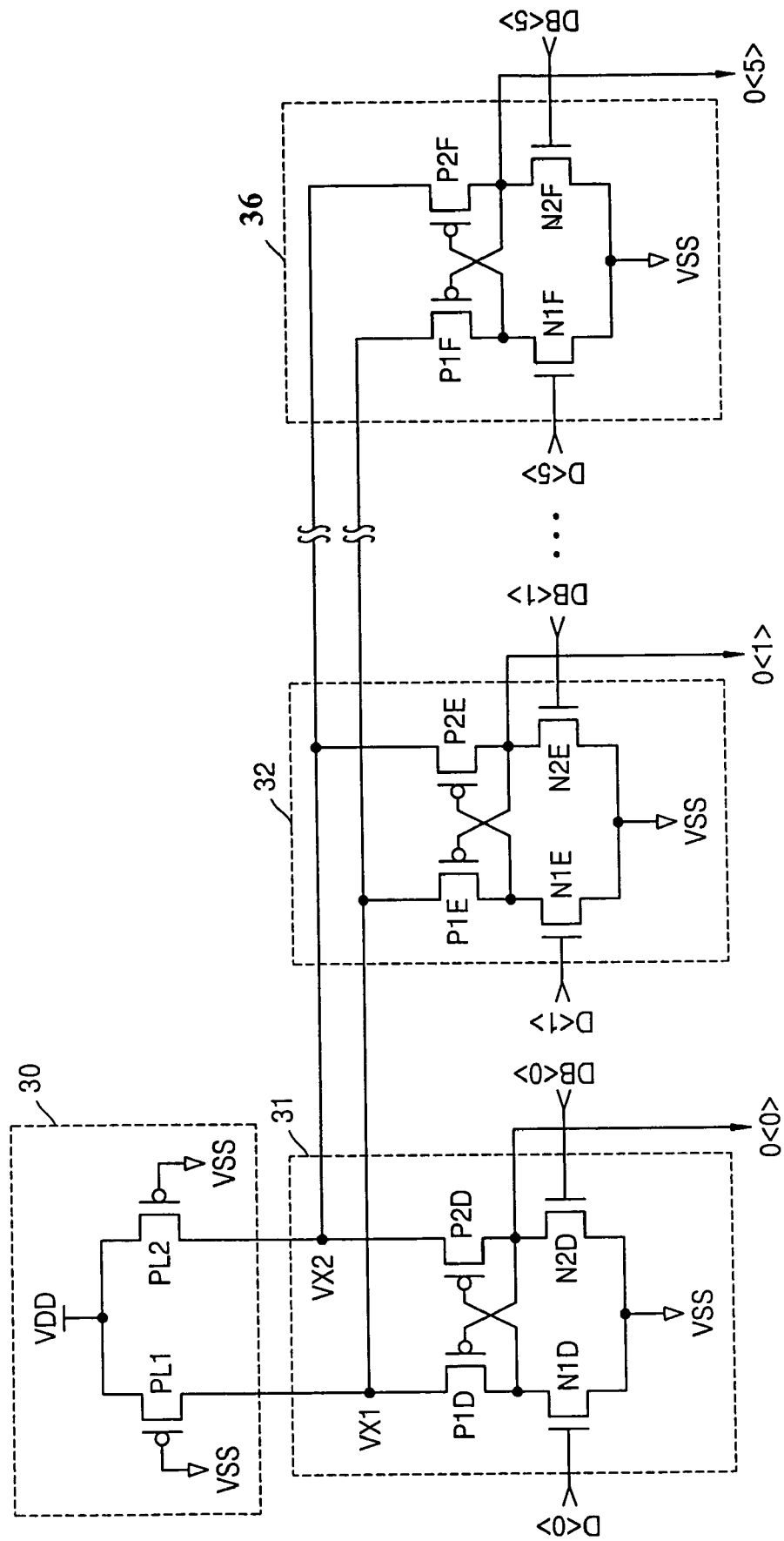
FIG. 3 is a circuit diagram of a multi-level shifter circuit of a flat panel source driver according to a first embodiment of the present disclosure.

FIG. 3 is a circuit diagram of a multi-level shifter circuit of a flat panel source driver according to a first embodiment of the present disclosure.

Referring to FIG. 3, the multi-level shifter circuit of a flat panel source driver according to the first embodiment of the present disclosure includes a voltage dropper 30 for dropping a source voltage VDD and outputting dropped source voltages VX1 and VX2. A plurality of level shifters 31 through 36 to which the dropped source voltages VX1 and VX2 are applied, which receive data D<5:0> composed of a plurality of bits with a low voltage and complementary data DB<5:0>, convert the levels of the data D<5:0> and the complementary data DB<5:0>, and output the output data 0<5:0> having a high voltage.

The voltage dropper 30 includes a first PMOS transistor PL1 and a second PMOS transistor PL2. A source of the first PMOS transistor PL1 is connected to the source voltage VDD, a gate of the transistor PL1 is connected to a ground voltage VSS, a drain of the PL1 outputs the dropped source voltage VX1. A source of the second PMOS transistor PL2 is connected to the source voltage VDD, a gate of the PL2 is connected to the ground voltage VSS, and a drain of the PL2 outputs the dropped source voltage VX2. The first PMOS transistor PL1 and the second PMOS transistor PL2 act as resistors.

The level shifters 31 through 36 each receives a corresponding bit of the data D<5:0> with the low voltage and a corresponding bit of the complementary data DB<5:0>, converts the levels of the data D<5:0> and the complementary data DB<5:0>, and outputs the output data 0<5:0> at a high voltage. In this case, the low voltage corresponds to a voltage lower than the dropped source voltages VX1 and VX2, and the high voltage corresponds to the dropped source voltages VX1 and VX2.

Each of the level shifters 31 through 36 includes two PMOS transistors, such as P1E and P2E of the level shifter 32, and two NMOS transistors N1E and N2E of the level shifter 32. Sources of the first PMOS transistors P1D, P1E, . . . , P1F are connected to the dropped source voltage VX1. Sources of the second PMOS transistors P2D, P2E, . . . , P2F are connected to the dropped source voltage VX2, and gates of the second PMOS transistors P2D, P2E, . . . , P2F are respectively connected to drains of the first PMOS transistors P1D, P1E, and P1F.

Drains of the first NMOS transistors N1D, N1E, . . . , N1F are respectively connected to the drains of the first PMOS transistors P1D, P1E, . . . , P1F. The corresponding bits of the data D<5:0> are applied to the gates of the first NMOS transistors N1D, N1E, . . . , N1F and sources are connected to the ground voltage VSS. Drains of the second NMOS transistors N2D, N2E, . . . , N2F are respectively connected to the drains of the second PMOS transistors P2D, P2E, . . . , P2F. The corresponding bit of the complementary data D<5:0> is applied to gates of the second NMOS transistors N2D, N2E, . . . , N2F, and sources of the N2D, N2E, . . . , N2F are connected to the ground voltage VSS. The operation of the level shifters 31 through 36 will now be understood and appreciated by those of ordinary skill in the pertinent art, so further detailed description thereof is omitted.

The multi-level shifter circuit according to the first embodiment of the present disclosure as described above includes the voltage dropper 30, where the dropped source voltages VX1 and VX2 dropped by the voltage dropper 30 are applied to each of the level shifters 31 through 36. In addition, the number of the PMOS transistors included in each of the level shifters 31 through 36 is two less than in a conventional multi-level shifter circuit. Therefore, the multi-level shifter circuit according to the first embodiment of the present disclosure produces smaller chips and consumes less current than a conventional multi-level shifter circuit.

Figure 4:
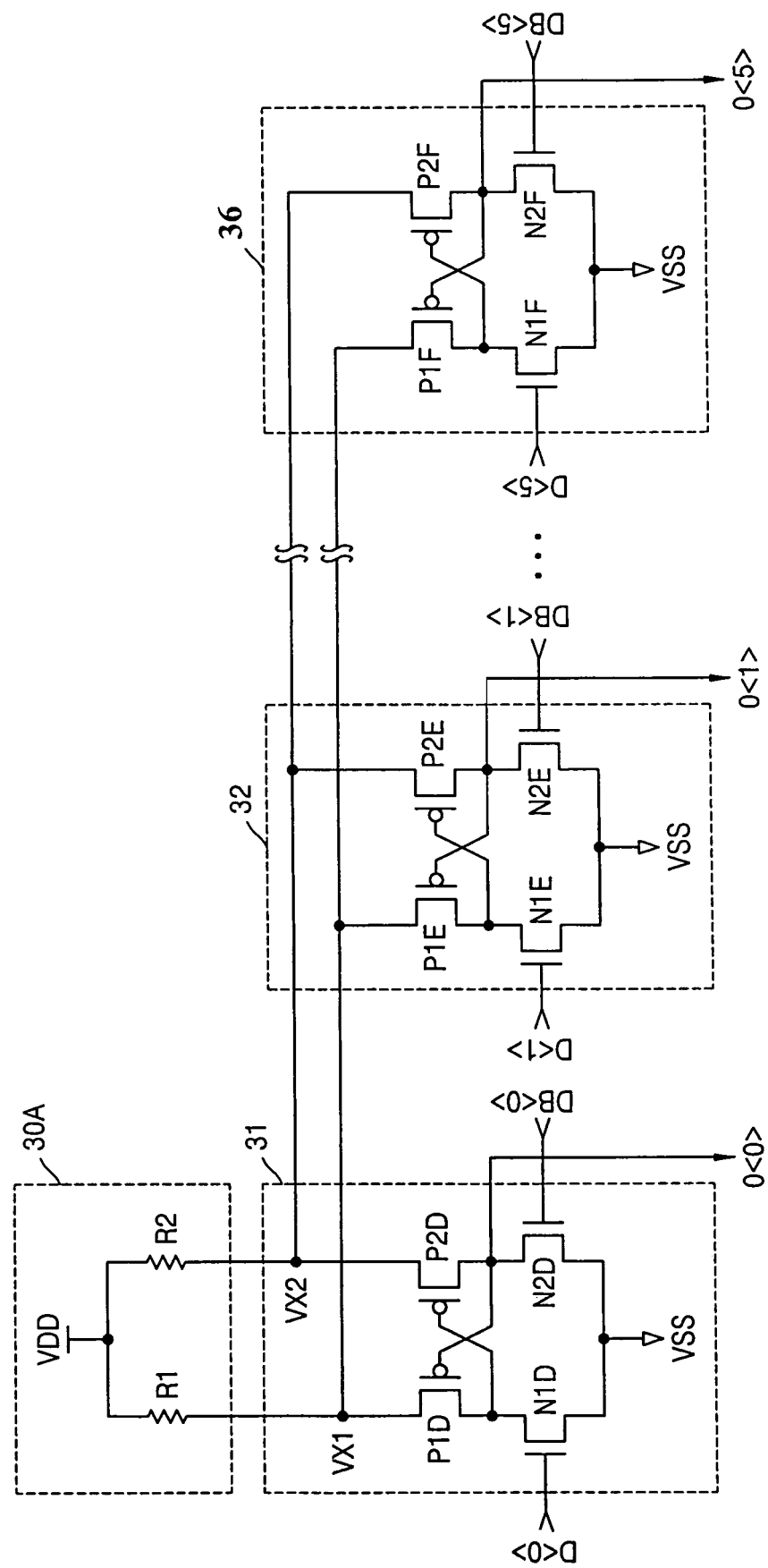
FIG. 4 is a circuit diagram of a multi-level shifter circuit of a flat panel source driver according to a second embodiment of the present disclosure.

FIG. 4 is a circuit diagram of a multi-level shifter circuit of a flat panel source driver according to a second embodiment of the present disclosure.

Referring to FIG. 4, the multi-level shifter circuit according to the second embodiment of the present disclosure and the multi-level shifter circuit according to the first embodiment of the present disclosure are identical, except for the configurations of the voltage droppers. That is, the configurations of the level shifters 31 through 36 of the second embodiment are the same as the configurations of the level shifters 31 through 36 of the first embodiment.

A voltage dropper 30A of the second embodiment includes a first resistor R1 for dropping the source voltage VDD to a dropped source voltage VX1, and a second resistor R2 for dropping the source voltage VDD to a dropped source voltage VX2. The output function of the voltage dropper 30A is comparable to that of the voltage dropper 30 of the first embodiment.

Figure 5:
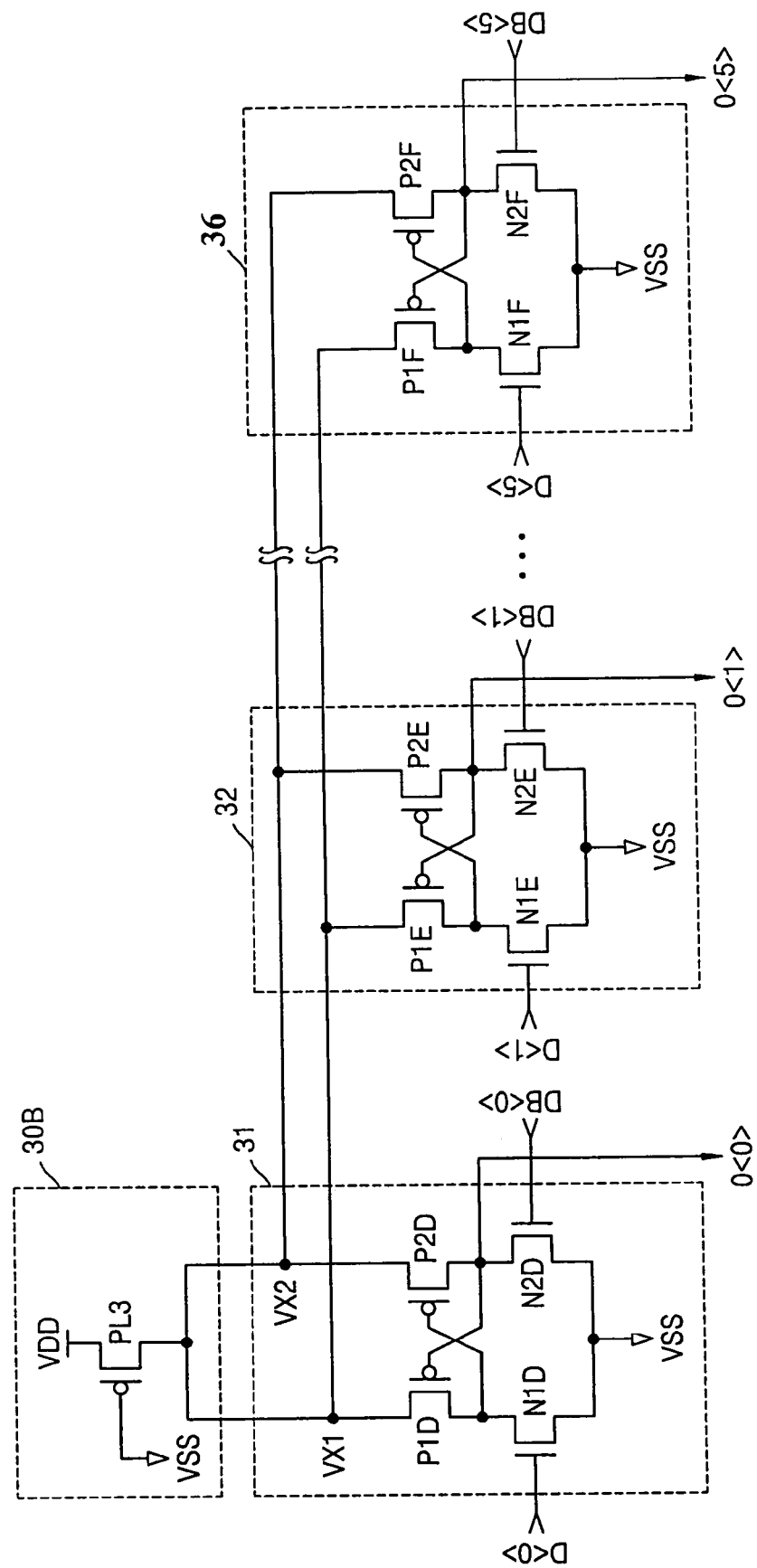
FIG. 5 is a circuit diagram of a multi-level shifter circuit of a flat panel source driver according to a third embodiment of the present disclosure.

FIG. 5 is a circuit diagram of a multi-level shifter circuit of a flat panel source driver according to a third embodiment of the present disclosure.

Referring to FIG. 5, the configuration of a voltage dropper 30B of the multi-level shifter circuit according to the third embodiment is different from the configurations of the voltage droppers 30 and 30A of the first and second embodiments, respectively. The configurations of the level shifters 31 through 36 of the third embodiment are the same as the configurations of the level shifters 31 through 36 of the first and second embodiments.

The voltage dropper 30B includes a PMOS transistor PL3 including a source connected to the source voltage VDD, a gate connected to the ground voltage VSS, and a drain for outputting dropped source voltages VX1 and VX2. The output function of the voltage dropper 30B is comparable to the function of the voltage droppers 30 and 30A of the first and second embodiments, respectively.

Figure 6:
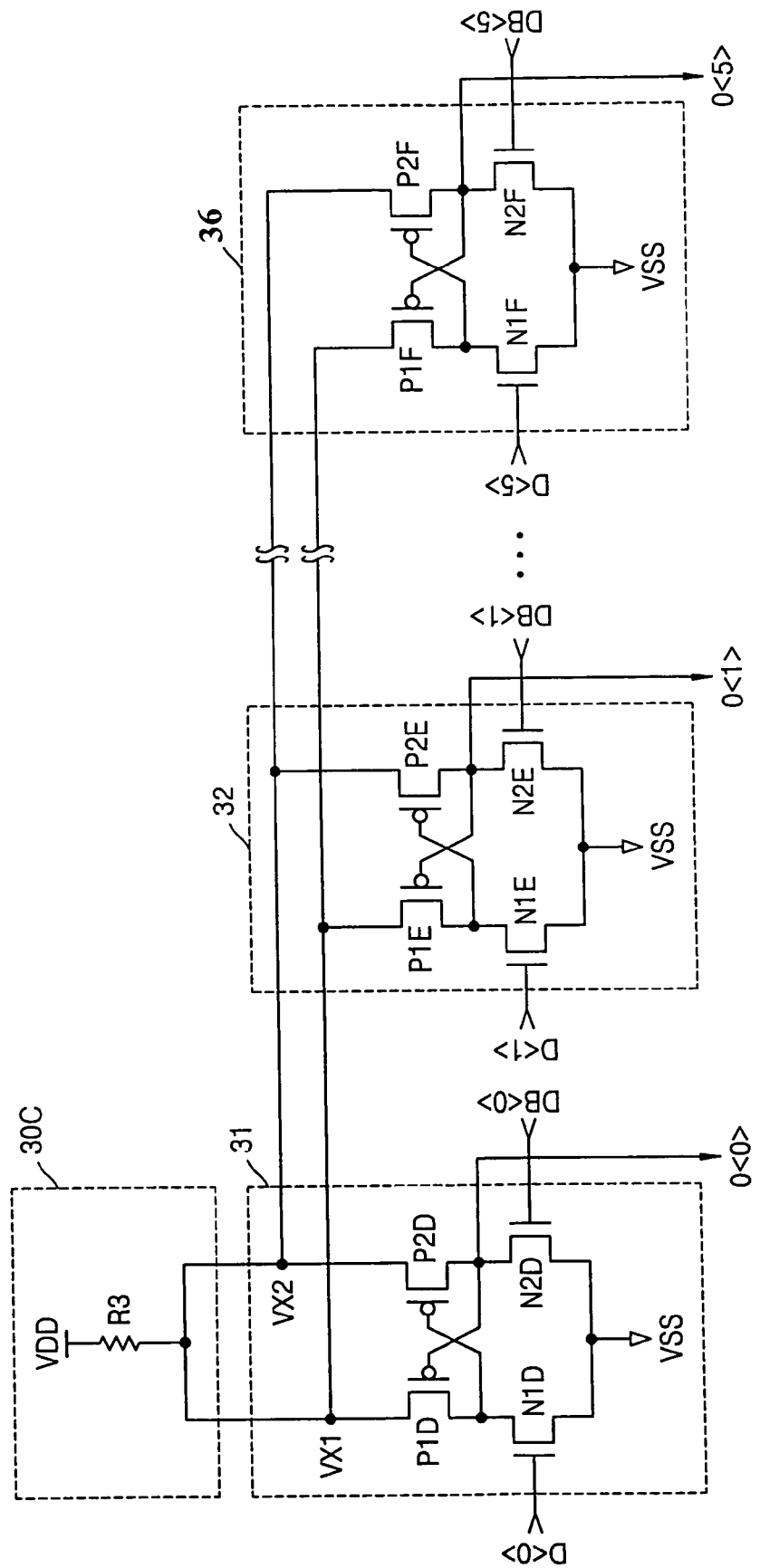
FIG. 6 is a circuit diagram of a multi-level shifter circuit of a flat panel source driver according to a fourth embodiment of the present disclosure.

FIG. 6 is a circuit diagram of a multi-level shifter circuit of a flat panel source driver according to a fourth embodiment of the present disclosure.

Referring to FIG. 6, the configuration of a voltage dropper 30C in the multi-level shifter circuit of a flat panel source driver according to the fourth embodiment is different from the configurations of the voltage droppers 30, 30A and 30B of the first, second and third embodiments, respectively. The configurations of the level shifters 31 through 36 of the fourth embodiment are the same as the configurations of the level shifters 31 through 36 of the first, second and third embodiments.

The voltage dropper 30C includes a resistor for dropping the source voltage VDD to the dropped source voltage VX1. The output function of the voltage dropper 30C is comparable to the function of the voltage droppers 30, 30A and 30B of the first, second and third embodiments, respectively.

A preferred embodiment multi-level shifter circuit of a flat panel source driver includes a voltage dropper. A source voltage is dropped by the voltage dropper, and two dropped source voltages are used by each of a plurality of level shifters. The number of PMOS transistors included in each of the level shifters is two fewer than the number included in level shifters of a conventional multi-level shifter circuit. Therefore, the multi-level shifter circuit of a flat panel source driver according to a preferred embodiment of the present disclosure has smaller chip size and less current consumption than a conventional multi-level shifter circuit.

While the present invention has been particularly shown and described with reference to exemplary embodiments thereof, it will be understood by those of ordinary skill in the pertinent art that various changes in form and details may be made therein without departing from the spirit and scope of the present invention, as defined by the following claims.

What is claimed is:

1. A multi-level shifter circuit of a flat panel source driver, the multi-level shifter circuit comprising:

a voltage dropper dropping a source voltage and outputting a dropped source voltage; and a plurality of level shifters to which the dropped source voltage is applied, receiving data composed of a plurality of bits and converting the level of the data, wherein the voltage dropper comprises at least one of:

a first PMOS transistor comprising a source connected to the source voltage, a gate connected to the ground voltage, and a drain outputting the dropped source voltage, and a second PMOS transistor comprising a source connected to the source voltage, a gate connected to the around voltage, and a drain outputting the dropped source voltage;

a first resistor dropping the source voltage to the dropped source voltage, and a second resistor dropping the source voltage to the dropped source voltage;

a PMOS transistor comprising a source connected to the source voltage, a gate connected to the ground voltage, and a drain outputting the dropped source voltage; or a resistor dropping the source voltage to the dropped source voltage.

2. The multi-level shifter circuit of a flat panel source driver of claim 1, wherein the voltage dropper comprises:

a first PMOS transistor comprising a source connected to the source voltage, a gate connected to the ground voltage, and a drain outputting the dropped source voltage; and a second PMOS transistor comprising a source connected to the source voltage, a gate connected to the ground voltage, and a drain outputting the dropped source voltage.

3. The multi-level shifter circuit of a fiat panel source driver of claim 1, wherein each of the level shifters comprises:

a first PMOS transistor comprising a source connected to the dropped source voltage, a gate, and a drain;

a second PMOS transistor comprising a source connected to the dropped source voltage, a gate connected to the drain of the first PMOS transistor, and a drain;

a first NMOS transistor comprising a drain connected to the drain of the first PMOS transistor, a gate receiving a corresponding bit of the data, and a source connected to the ground voltage; and a second NMOS transistor comprising a drain connected to the drain of the second PMOS transistor, a gate receiving a corresponding bit of complementary data, and a source connected to the ground voltage.

4. The multi-level shifter circuit of a flat panel source driver of claim 1, wherein the voltage dropper comprises:

a first resistor dropping the source voltage to the dropped source voltage; and a second resistor dropping the source voltage to the dropped source voltage.

5. The multi-level shifter circuit of a flat panel source driver of claim 1, wherein the voltage dropper comprises a PMOS transistor comprising a source connected to the source voltage, a gate connected to the ground voltage, and a drain outputting the dropped source voltage.

6. The multi-level shifter circuit of a flat panel source driver of claim 1, wherein the voltage dropper comprises a resistor dropping the source voltage to the dropped source voltage.

7. A multi-level shifter comprising:

a voltage dropper In signal communication with a source voltage; and at least one level shifter In signal communication with the voltage dropper for receiving data and converting the voltage level of the data, wherein the voltage dropper comprises at least one of:

a first transistor in signal communication with the source voltage and a ground voltage for outputting a first dropped source voltage, and a second transistor in signal communication with the source voltage and the ground voltage for outputting a second dropped source voltage;

a first resistor in signal communication with the source voltage, and a second resistor in signal communication with the source voltage;

a transistor having a first terminal in signal communication with the source voltage, a second terminal in signal communication with a ground voltage, and a third terminal for outputting a dropped sourced voltage; or a resistor in signal communication with the source voltage for dropping the source voltage.

8. A multi-level shifter as defined in claim 7, the voltage dropper comprising:

a first transistor in signal communication with the source voltage and a ground voltage for outputting a first dropped source voltage; and a second transistor in signal communication with the source voltage and the ground voltage for outputting a second dropped source voltage.

9. A multi-level shifter as defined in claim 8 wherein the first and second transistors are PMOS transistors, each having its source terminal in signal communication with the source voltage, its gate terminal in signal communication with the ground voltage, and its drain terminal in signal communication with a respective dropped voltage.

10. A multi-level shifter as defined in claim 7, the at least one level shifter comprising:

a first transistor having a first terminal in signal communication with me voltage dropper;

a second transistor having a first terminal in signal communication with the voltage dropper and a second terminal in signal communication with a third terminal of the first transistor;

a third transistor having a third terminal in signal communication with the third terminal of the first transistor, a second terminal for receiving a bit of the data, and a first terminal in signal communication with a ground voltage; and a fourth transistor having a third terminal in signal communication with a third terminal of the second transistor, a second terminal for receiving a bit of complementary data, and a first terminal in signal communication with the ground voltage.

11. A multi-level shifter as defined in claim 10 wherein:

the first and second transistors are PMOS transistors with their first, second and third terminals being source, gate and drain terminals, respectively; and the third and fourth transistors are NMOS transistors with their first, second and third terminals being source, gate and drain terminals, respectively.

12. A multi-level shifter as defined in claim 7, the voltage dropper comprising:
- a first resistor in signal communication with the source voltage; and
- a second resistor in signal communication with the source voltage.

13. A multi-level shifter as defined in claim 7 wherein the voltage dropper comprises a transistor having a first terminal in signal communication with the source voltage, a second terminal in signal communication with a ground voltage, and a third terminal for outputting a dropped source voltage.

14. A multi-level shifter as defined in claim 13 wherein the transistor is a PMOS transistor with its first, second and third terminals being source, gate and drain terminals, respectively.

15. A multi-level shifter as defined in claim 7, the voltage dropper comprising a resistor in signal communication with the source voltage for dropping the source voltage.

16. A multi-level shifting method comprising:
- receiving data having a number of bits;
- providing a number of single-bit level shifters corresponding to the number of bits;
- receiving a source voltage;
- dropping the received source voltage to at least one dropped voltage;
- applying the at least one dropped voltage to the provided number of single-bit level shifters; and
- converting the voltage level of each of the number of bits of the received data.

17. A multi-level shifting method as defined in claim 16, the step of converting the voltage level comprising:
- receiving a first dropped voltage at a first transistor;
- receiving a second dropped voltage at a second transistor;
- receiving a data bit at a third transistor;
- receiving a complementary data bit at a fourth transistor;
- sharing a terminal between the first, second and third transistors; and
- sharing another terminal between the first, second and fourth transistors for outputting a level shifted data bit.

18. A flat panel source driver comprising a multi-level shifter, the multi-level shifter comprising:
- a voltage dropper in signal communication with a source voltage; and
- at least one level shifter in signal communication with the voltage dropper for receiving data and converting the voltage level of the data, wherein the flat panel is a liquid crystal display.

19. A flat panel source driver as defined in claim 18, the at least one level shifter comprising a plurality of level shifters corresponding to the number of bits in the received data.

* * * * *